United States Patent
Sakamoto et al.

(10) Patent No.: US 9,080,254 B2
(45) Date of Patent: Jul. 14, 2015

(54) METHOD OF PRODUCING SIC SINGLE CRYSTAL

(75) Inventors: Hidemitsu Sakamoto, Susono (JP);
Hironori Daikoku, Susono (JP);
Yasuyuki Fujiwara, Shizuoka-ken (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 881 days.

(21) Appl. No.: 13/202,096

(22) PCT Filed: Mar. 11, 2010

(86) PCT No.: PCT/IB2010/000515
§ 371 (c)(1),
(2), (4) Date: Aug. 18, 2011

(87) PCT Pub. No.: WO2010/103387
PCT Pub. Date: Sep. 16, 2010

(65) Prior Publication Data
US 2011/0315073 A1    Dec. 29, 2011

(30) Foreign Application Priority Data
Mar. 12, 2009   (JP) ................. 2009-059987

(51) Int. Cl.
*C30B 15/30* (2006.01)
*C30B 29/36* (2006.01)
(Continued)

(52) U.S. Cl.
CPC . *C30B 29/36* (2013.01); *C30B 9/06* (2013.01);
*C30B 17/00* (2013.01); *C30B 19/04* (2013.01);
(Continued)

(58) Field of Classification Search
CPC ........ C30B 15/00; C30B 17/00; C30B 19/04; C30B 29/36; C30B 9/06
USPC .......................................................... 117/28
See application file for complete search history.

(56) References Cited

U.S. PATENT DOCUMENTS

2007/0209573 A1*   9/2007   Kusunoki et al. ............... 117/28

FOREIGN PATENT DOCUMENTS

EP      1 806 437 A1    7/2007
JP      2004-2173       1/2004
(Continued)

OTHER PUBLICATIONS

Effects of cycle patterns of accelerated crucible rotation technique (ACRT) on the flows, interface, and segregation in vertical Bridgman crystal growth, Y.C. Liu, B. Roux, C.W. Lan, International Journal of Heat and Mass Transfer 50 (2007) 5031-5040.*
(Continued)

*Primary Examiner* — Bob M Kunemund
*Assistant Examiner* — Hua Qi
(74) *Attorney, Agent, or Firm* — Finnegan, Henderson, Farabow, Garrett & Dunner, LLP (57) ABSTRACT

In a method of producing a SiC single crystal, the SiC single crystal is grown on a SiC seed crystal by bringing the SiC seed crystal, which is fixed at a rotatable seed crystal fixing shaft, into contact with a solution produced by dissolving carbon in melt containing silicon in a rotatable crucible. The method includes starting rotation of the seed crystal fixing shaft, and starting rotation of the crucible after a predetermined delay time (Td); then stopping the rotation of the seed crystal fixing shaft and the rotation of the crucible simultaneously; then stopping the seed crystal fixing shaft and the crucible for a predetermined stop time (Ts); and repeating a rotation/stop cycle.

7 Claims, 5 Drawing Sheets

(51) Int. Cl.
  *C30B 9/06* (2006.01)
  *C30B 17/00* (2006.01)
  *C30B 19/04* (2006.01)
  C30B 15/32 (2006.01)
  C30B 15/10 (2006.01)
  C30B 9/10 (2006.01)

(52) U.S. Cl.
  CPC . *C30B 9/10* (2013.01); *C30B 15/10* (2013.01); *C30B 15/30* (2013.01); *C30B 15/305* (2013.01); *C30B 15/32* (2013.01)

(56) References Cited

FOREIGN PATENT DOCUMENTS

| JP | 2005-179080 | 7/2005 |
|---|---|---|
| JP | 2006-69861 | 3/2006 |
| JP | 2006-117441 | 5/2006 |
| JP | 2007-284301 | 11/2007 |
| JP | 2008-100854 | 5/2008 |
| JP | 2008-100890 | 5/2008 |

OTHER PUBLICATIONS

D. Hofmann et al., "Prospects of the Use of Liquid Phase Techniques for the Growth of Bulk Silicon Carbide Crystals," Materials Science and Engineering, B61-62, pp. 29-39 (1999).

K. Kusunoki et al., "Solution Growth of SiC Crystal with High Growth Rate Using Accelerated Crucible Rotation Technique," Materials Science Forum vols. 527-529, pp. 119-122 (2006).

H. Scheel et al., "Flux Growth of Large Crystals by Accelerated Crucible-Rotation Technique," Journal of Crystal Growth, vol. 8, pp. 304-306 (1971).

International Search Report in International Application No. PCT/IB2010/000515; Mailing Date: Jun. 16, 2010.

Written Opinion of the International Searching Authority in International Application No. PCT/IB2010/000515; Mailing Date: Jun. 16, 2010.

\* cited by examiner

IDEAL CONVECTION FLOW IS VISUALLY SIMULATED
(CARBON IS CARRIED ONTO SEED CRYSTAL BY
UPWARD FLOW AT CENTER PORTION)

FIG. 5

GROWTH SURFACE OF SiC CRYSTAL
PRODUCED IN FOURTH EXAMPLE

FIG. 6

ACRT PATTERN IN WHICH SEED CRYSTAL FIXING SHAFT AND CRUCIBLE ARE NOT SIMULTANEOUSLY STOPPED, AND CRUCIBLE IS STOPPED AFTER SEED CRYSTAL FIXING SHAFT IS STOPPED

METHOD OF PRODUCING SIC SINGLE CRYSTAL

CROSS-REFERENCE TO RELATED APPLICATIONS

This application is a national phase application of International Application No. PCT/IB2010/000515, filed Mar. 11, 2010, and claims the priority of Japanese Application No. 2009-059987, filed Mar. 12, 2009, the contents of both of which are incorporated herein by reference.

BACKGROUND OF THE INVENTION

1. Field of the Invention

The invention relates to a method of producing a SiC single crystal using a solution technique.

2. Description of the Related Art

SiC has an energy band gap that is wider than that of Si. Therefore, Various techniques have been proposed for producing a high-quality SiC single crystal that is suitable for being used as, for example, a semiconductor material. Various methods of producing the SiC single crystal have been attempted. Among them, a sublimation technique and a solution technique are most commonly used at present. When using the sublimation technique, a growth rate is high. However, a defect, such as a micropipe, is likely to occur, and a crystal polymorph is likely to be formed. In contrast, when using the solution technique, the defect, such as the micropipe, is not likely to occur, and the crystal polymorph is not likely to be formed, although the growth rate is low. Therefore, the solution technique is considered to be a promising technique.

In a method of producing a SiC single crystal using the solution technique, a crucible made of a material containing carbon (graphite in general) is used. A material containing silicon is molten in the crucible. In melt containing silicon in the crucible, a temperature gradient is maintained so that the temperature of the melt decreases from an inner portion of the melt toward a surface of the melt. Carbon is dissolved from a high-temperature lower portion of the crucible into the melt (i.e., a solvent) containing silicon. Then, carbon is carried upward mainly by a convection flow of the melt. When the carbon reaches a low-temperature portion near the surface of the melt, the low-temperature portion is oversaturated. A seed crystal, which is fixed at an end of a seed crystal fixing shaft, is brought into contact with the surface of the solution produced by dissolving carbon into the melt containing silicon. Thus, the SiC single crystal is grown on a lower surface (i.e., a solution contact surface) of the seed crystal.

However, various technical problems need to be solved to produce a high-quality SiC crystal with a large area at a high growth rate using the solution-growth technique.

For example, a technical problem that needs to be solved to produce a high-quality SiC crystal is described in Materials Science and Engineering, B61-62 (1999) 29-39. In the publication, it is described that when a SiC single crystal is grown using a solution containing an Si solvent, inclusion of Si is caused in the SiC crystal. The inclusion is a collective term for phases that exist in the SiC single crystal, and that are different from the SiC single crystal. That is, the term "the inclusion" signifies heterophases mixed into the SiC single crystal. Typical example of the inclusion is a particle derived from a droplet of Si or C. Examples of the inclusion include silicides, carbides, nitrides, and oxides. Examples of the inclusion further include a SiC crystal different from a given crystal polymorph, for example, a 3C—SiC crystal mixed into a 6H—SiC single crystal, and gas (air bubbles) confined in a crystal. The inclusion is caused by a non-uniform surface in a growth interface, that is, "morphological instability". The non-uniform surface has a macrostep structure. It is considered that Si in a solvent enters an area between macrosteps, and Si is confined in the crystal due to the growth of the steps in a lateral direction.

Japanese Patent Application Publication No. 2006-117441 (JP-A-2006-117441) describes a method of producing a silicon carbide single crystal using the solution-growth technique, in order to provide a SiC single crystal production method that makes it possible to produce a high-quality SiC single crystal in which no inclusion exists, at a high rate. In the method, melt is agitated by periodically changing the rotational speed, or the rotational speed and the rotational direction of a crucible, that is, by a so-called Accelerated Crucible Rotation Technique (ACRT).

When the SiC single crystal was actually grown under a condition described in the publication No. 2006-117441. As a result, flatness of a growth surface of the produced single crystal varied, and the growth rate was not as high as expected.

Figure 1:
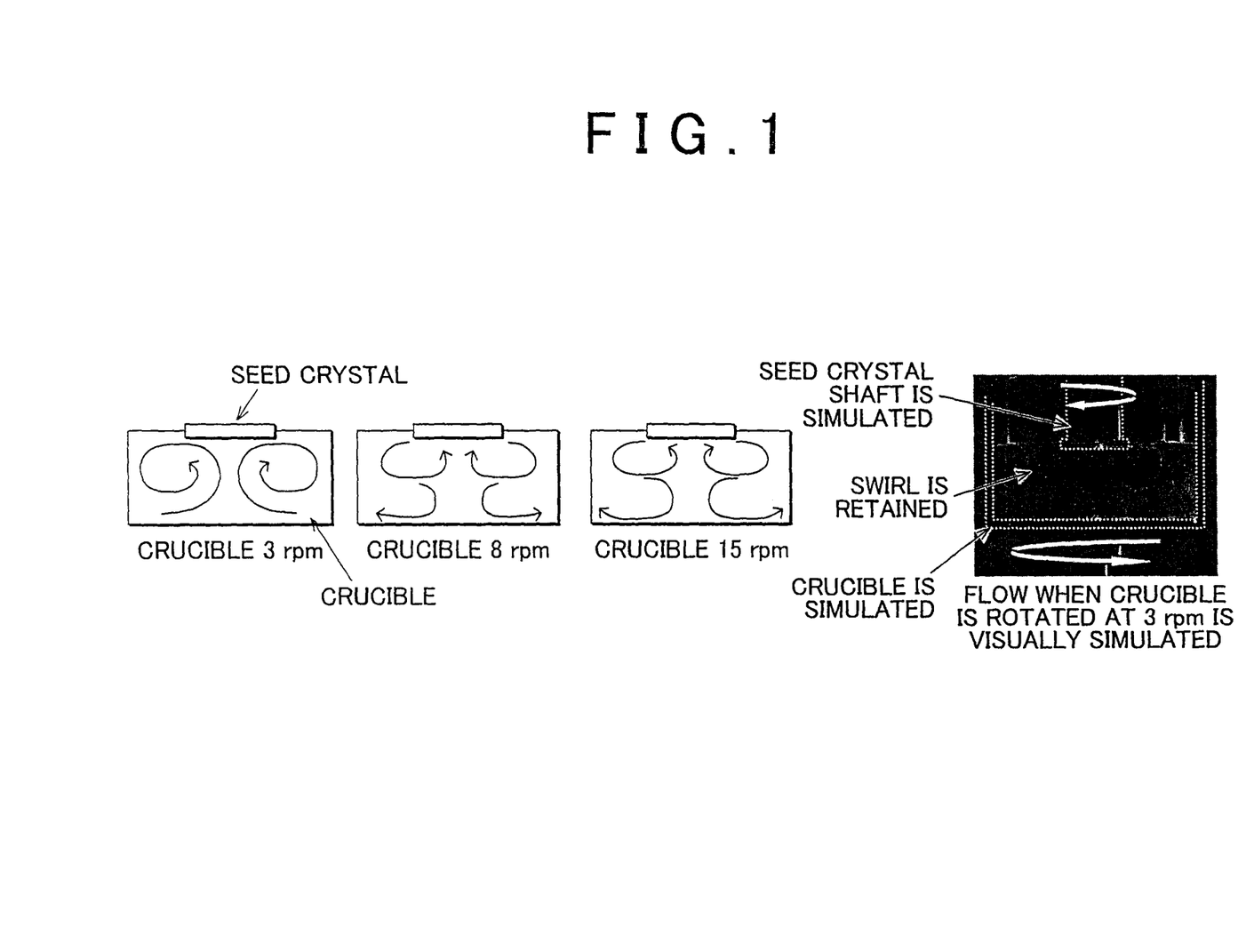
FIG. 1 shows a device that visually simulates a flow of a solution, and a diagram showing the flow of the solution visually simulated using the device.

In order to clarify the cause of the above-described situation, a device that visually simulates a flow of the solution in the crucible was developed, and the flow of the solution was analyzed using the device. As a result, it was found that an ideal upward flow was not generated at a center portion (refer to FIG. 1). That is, it was found that there was a high possibility that a swirl was retained around a seed crystal, and dissolved carbon was not efficiently carried onto the seed crystal.

SUMMARY OF THE INVENTION

The invention provides a method that grows a high-quality SiC single crystal at a high rate using a solution-growth technique by finding an ideal Accelerated Crucible Rotation Technique (ACRT) pattern in a so-called Accelerated Crucible Rotation Technique (ACRT), and generating an ideal flow of a solution.

An aspect of the invention relates to a method of producing a SiC single crystal, in which the SiC single crystal is grown on a SiC seed crystal by bringing the SiC seed crystal, which is fixed at a rotatable seed crystal fixing shaft, into contact with a solution produced by dissolving carbon in melt containing silicon in a rotatable crucible. The method includes starting rotation of the seed crystal fixing shaft, and starting rotation of the crucible after a predetermined delay time (Td); then stopping the rotation of the seed crystal fixing shaft and the rotation of the crucible simultaneously; then stopping the seed crystal fixing shaft and the crucible for a predetermined stop time (Ts); and repeating a rotation/stop cycle including starting the rotation of the seed crystal fixing shaft, and starting the rotation of the crucible after the predetermined delay time, then stopping the rotation of the seed crystal fixing shaft and the rotation of the crucible simultaneously, and then stopping the seed crystal fixing shaft and the crucible for the predetermined stop time.

In the method according to the above-described aspect, the predetermined delay time may be adjusted according to viscosity of the solution. The predetermined stop time may be adjusted according to the viscosity of the solution. The predetermined delay time may be 1 to 10 seconds, and the predetermined stop time may be 1 to 10 seconds. The predetermined delay time may be 5 seconds, and the predetermined stop time may be 10 seconds.

In the method according to the above-described aspect, after the rotation of the seed crystal fixing shaft is started, a rotational speed of the seed crystal fixing shaft may be increased, and then, the rotational speed of the seed crystal fixing shaft may be maintained at a first predetermined value for a first rotation maintenance time, and then, the rotational speed of the seed crystal fixing shaft may be decreased to zero; and after the rotation of the crucible is started, a rotational speed of the crucible may be increased, and then, the rotational speed of the crucible may be maintained at a second predetermined value for a second rotation maintenance time, and then, the rotational speed of the crucible may be decreased to zero.

In the method according to the above-described aspect, in the rotation/stop cycle, a first rotational speed increase time, during which the rotational speed of the seed crystal fixing shaft is increased, may be 1 to 10 seconds; the first rotation maintenance time may be 1 to 10 seconds; a first rotational speed decrease time, during which the rotational speed of the seed crystal fixing shaft is decreased, may be 1 to 10 seconds; a second rotational speed increase time, during which the rotational speed of the crucible is increased, may be 1 to 10 seconds; the second rotation maintenance time may be 1 to 10 seconds; and a second rotational speed decrease time, during which the rotational speed of the crucible is decreased, may be 1 to 10 seconds.

In the method according to the above-described aspect, in the rotation/stop cycle, the seed crystal fixing shaft and the crucible may be rotated in a same rotational direction.

BRIEF DESCRIPTION OF THE DRAWINGS

The foregoing and further objects, features and advantages of the invention will become apparent from the following description of example embodiments with reference to the accompanying drawings, wherein like numerals are used to represent like elements and wherein.

DETAILED DESCRIPTION OF EMBODIMENTS

The solution-growth technique for the SiC single crystal is a method in which a SiC single crystal is grown by bringing a SiC seed crystal into contact with a solution produced by dissolving carbon in melt (i.e., a solvent) containing silicon (hereinafter, the solution will be referred to as "Si—C solution"). The SiC seed crystal is attached at an end of a seed crystal fixing shaft, brought into contact with the Si—C solution, and pulled up by the seed crystal fixing shaft. Thus, the SiC single crystal is grown on the SiC seed crystal using the Si—C solution.

In a typical solution-growth technique for the SiC single crystal, a crucible made of a material containing carbon (graphite in general) is used. The crucible is heated by a heat source, for example, by high-frequency induction heating, and thus, a material containing silicon supplied into the crucible is molten. As a result, melt containing silicon is produced in the crucible. Carbon supplied from the crucible is dissolved into the melt (i.e., the solvent) containing silicon, and thus, the Si—C solution is produced. The SiC seed crystal fixed at the end of the seed crystal fixing shaft is brought into contact with a surface of the Si—C solution, and thus, the SiC single crystal is grown on a lower surface of the seed crystal. In the invention, when the seed crystal is brought into contact with the surface of the Si—C solution, a portion of the seed crystal may be immersed in the solution.

The ACRT is a method in which when the single crystal is grown using the solution in the crucible, the rotational speed of the crucible, which is a container, is changed, or the rotational speed and the rotational direction of the crucible are changed, that is, the rotation of the crucible is accelerated. This method was proposed by Sheet and Shulz-DuBois (J. Crystal Growth 8 (1971) 304). Thus, this method itself is a known technique. By accelerating the rotation of the crucible, agitation of the solution is promoted. In the method according to the invention, the seed crystal fixing shaft, at which the seed crystal is fixed, may be rotated in the same rotational direction as the rotational direction in which the crucible is rotated, or in a rotational direction opposite to the rotational direction in which the crucible is rotated. By rotating the seed crystal fixing shaft, the agitation of the solution is further promoted.

The method according to the invention includes starting the rotation of the seed crystal fixing shaft, and starting the rotation of the crucible after a predetermined delay time (Td); then stopping the rotation of the seed crystal fixing shaft and the rotation of the crucible simultaneously; then stopping the seed crystal fixing shaft and the crucible for a predetermined stop time (Ts); and repeating a rotation/stop cycle including starting the rotation of the seed crystal fixing shaft, and starting the rotation of the crucible after a predetermined delay time (Td), then stopping the rotation of the seed crystal fixing shaft and the rotation of the crucible simultaneously; and then stopping the seed crystal fixing shaft and the crucible for a predetermined stop time (Ts).

Figure 2:
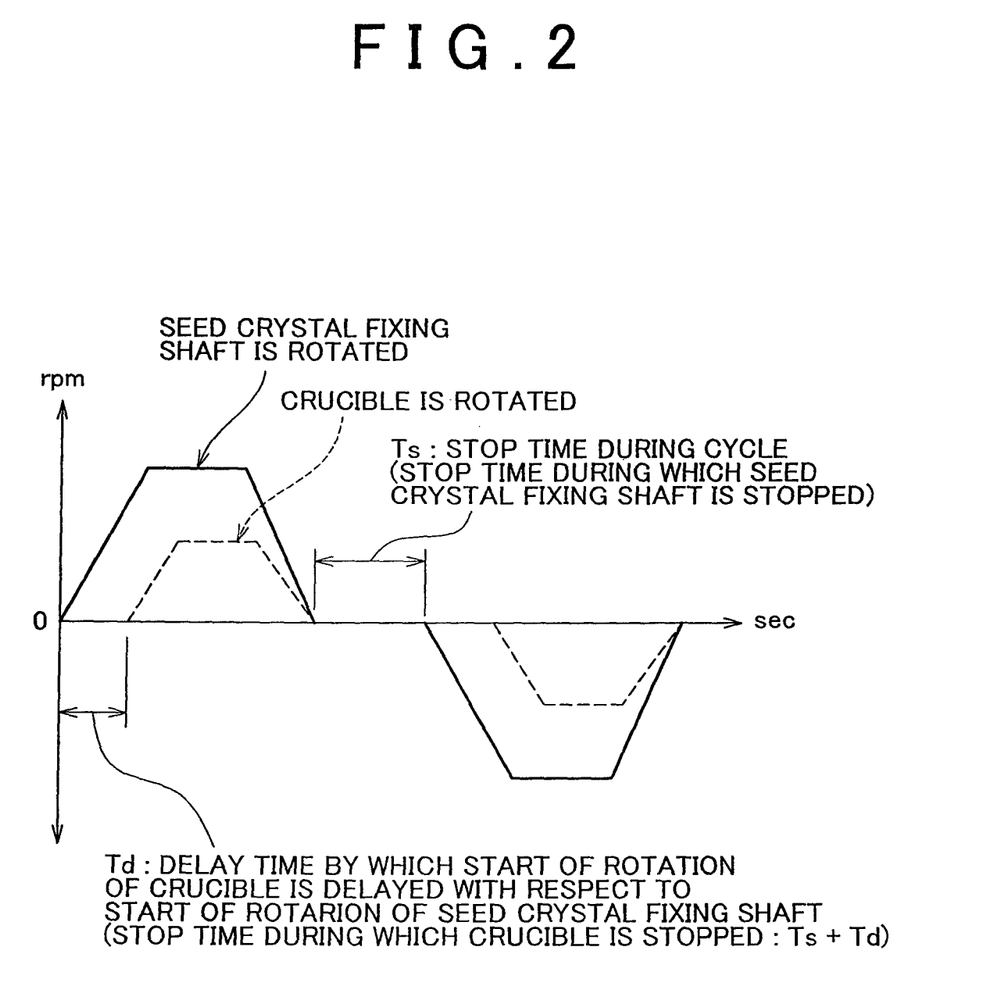
FIG. 2 shows an example of an ACRT pattern according to an embodiment of the invention.

An ACRT pattern according to an embodiment of the invention will be described with reference to FIG. 2. First, the seed crystal fixing shaft is rotated and the rotational speed of the seed crystal fixing shaft is increased. After the rotational speed of the seed crystal fixing shaft is maintained at a first predetermined value for a first rotation maintenance time, the rotational speed of the seed crystal fixing shaft is decreased to zero. Then, the seed crystal fixing shaft is stopped for the predetermined stop time (Ts) until the start of the next rotation/stop cycle. The rotation of the crucible starts after the predetermined delay time (Td) after the start of the rotation of the seed crystal fixing shaft. The rotational speed of the crucible is increased, and then, the rotational speed of the crucible is maintained at a second predetermined value for a second rotation maintenance time, and then, the rotational speed of the crucible is decreased to zero so that the rotation of the crucible is stopped, as well as the seed crystal fixing shaft. The rotation of the crucible is stopped at the same timing as the timing at which the rotation of the seed crystal fixing shaft is stopped. Then, the crucible is stopped for the predetermined stop time (Ts) until the start of the next rotation/stop cycle. This rotation/stop cycle is repeated. The rotational direction of each of the seed crystal fixing shaft and the crucible may be the same as the rotational direction in the immediately preceding rotation/stop cycle. Alternatively, the rotational direction may be reversed each time the rotation/stop cycle starts (FIG. 2 shows an example in which the rotational direction is reversed).

The predetermined delay time (Td) may be appropriately adjusted according to, for example, viscosity of the solution. The predetermined delay time (Td) is preferably 1 to 10 seconds. The predetermined stop time (Ts) may be appropriately adjusted according to, for example, the viscosity of the solution. The predetermined stop time (Ts) is preferably 1 to 10 seconds. Further, in the rotation/stop cycle, a first rotational speed increase time during which the rotational speed of the seed crystal fixing shaft is increased, the first rotation maintenance time, and a first rotational speed decrease time during which the rotational speed of the seed crystal fixing shaft is decreased may be appropriately adjusted, taking into account other parameters such as the viscosity of the solution and the rotational speed. Each of the first rotational speed increase time, the first rotation maintenance time, and the first rotational speed decrease time is preferably 1 to 10 seconds. In the rotation/stop cycle, a second rotational speed increase time during which the rotational speed of the crucible is increased, the second rotation maintenance time, and a second rotational speed decrease time during which the rotational speed of the crucible is decreased may be appropriately adjusted, taking into account other parameters such as the viscosity of the solution and the rotational speed. Each of the second rotational speed increase time, the second rotation maintenance time, and the second rotational speed decrease time is preferably 1 to 10 seconds.

In a conventional ACRT, the crucible and the seed crystal fixing shaft are rotated in synchronization with each other, that is, the rotation of the crucible starts at the same timing as the timing at which the rotation of the seed crystal fixing shaft starts. The inventors analyzed the flow of the solution in the crucible generated by the conventional rotation technique, using a device (refer to FIG. 1) that visually simulates the convection flow of the solution. As a result, the inventors found that an ideal upward flow of the solution was not generated at a center portion of the crucible. When the ideal upward flow is not generated at the center portion of the crucible, there is a high possibility that carbon dissolved in the crucible may not be efficiently carried onto the seed crystal. By repeating the rotation/stop cycle for the seed crystal fixing shaft and the crucible, the force of the upward flow of the solution is increased, and thus, dissolved carbon is efficiently carried onto the SiC seed crystal. As a result, the growth rate, at which the SiC single crystal is grown, is increased, and a high-quality SiC single crystal is produced. In the invention, it is determined whether the produced SiC single crystal has high quality, by observing flatness of the produced crystal, and determining whether there is inclusion of the solvent or air bubbles.

It is preferable that the seed crystal fixing shaft and the crucible should be rotated in the same rotational direction in the rotation/stop cycle. Even when the seed crystal fixing shaft and the crucible are rotated in different rotational directions, advantageous effects of the invention are obtained. However, particularly when the seed crystal fixing shaft and the crucible are rotated in the same rotational direction, the ideal upward flow is more likely to be generated.

The crucible is rotated by an ordinary drive mechanism. For example, the crucible may be disposed on a plate that is rotated by a motor, a belt conveyer, or the like, and thus, the crucible may be rotated. The drive mechanism has, for example, an appropriate function of adjusting the rotational speed, and an appropriate function of reversing the rotational direction so that the drive mechanism is able to rotate the crucible according to any ACRT pattern.

The seed crystal fixing shaft is also rotated by an ordinary drive mechanism. A portion of the seed crystal fixing shaft, which is opposite to a seed crystal fixing portion at which the seed crystal is fixed, may be connected to a rotation drive mechanism such as a motor, and thus, the seed crystal fixing shaft may be rotated. The drive mechanism has, for example, an appropriate function of adjusting the rotational speed and an appropriate function of reversing the rotational direction so that the drive mechanism is able to rotate the seed crystal fixing shaft according to any ACRT pattern. The seed crystal fixing shaft includes a mechanism for moving the seed crystal fixing shaft upward and downward in an axial direction, in order to bring the fixed seed crystal into contact with the solution in the crucible. As the mechanism for moving the seed crystal fixing shaft upward and downward, for example, an ordinary hoisting mechanism may be used.

It is preferable that the seed crystal fixing shaft should be moved downward to a center of the surface of the solution, or a position near the center of the surface of the solution so that dissolved carbon is efficiently carried to the crystal growth surface of the seed crystal that is in contact with the surface of the solution, by the ideal upward flow of the solution generated in the crucible according to the invention.

As a method of fixing the SiC seed crystal to the seed crystal fixing shaft, it is possible to employ a method in which, for example, a groove is formed at the end of the seed crystal fixing shaft, and the seed crystal is mechanically fixed by fitting the seed crystal into the groove.

Another method of fixing the seed crystal to the seed crystal fixing shaft may be a method in which the seed crystal is attached to the end of the seed crystal fixing shaft using an adhesive agent. The adhesive agent used to attach the seed crystal to the seed crystal fixing shaft may be a thermosetting resin. Most of the thermosetting resins are generally adhesive at room temperature. Thus, it is easy to attach the seed crystal to the end of the seed crystal fixing shaft using the thermosetting resin. When the thermosetting resin is heated at an appropriate curing temperature (up to approximately 200° C. in general), the thermosetting resin is hardened and provides adhesive force. Thus, the thermosetting resin is advantageous as the adhesive agent component. When the temperature of the adhesive agent is further increased, an organic substance such as the thermosetting resin is carbonized. That is, the organic substance is changed to a carbon-rich substance through heat decomposition. When the substance has a high carbonization ratio, the adhesive strength of the substance is stably maintained even at a high temperature. As the thermosetting resin, for example, phenol resins, epoxy resins, polyimide resins, and polyester resins may be used.

As the adhesive agent used in the invention, a solvent in which the thermosetting resin is dissolved and/or dispersed may be used as required, in addition to SiC particles and the thermosetting resin. The solvent may be appropriately selected among organic or inorganic solvents, according to, for example, the kind of the thermosetting resin. Only one kind of solvent may be used, or two or more different kinds of solvents may be used in combination. For example, the solvent may be water and/or alcohol (for example, methyl alcohol, ethyl alcohol, n-propyl alcohol, or isopropyl alcohol).

EXAMPLES

Hereinafter, an example of the invention will be described specifically.

Figure 3:
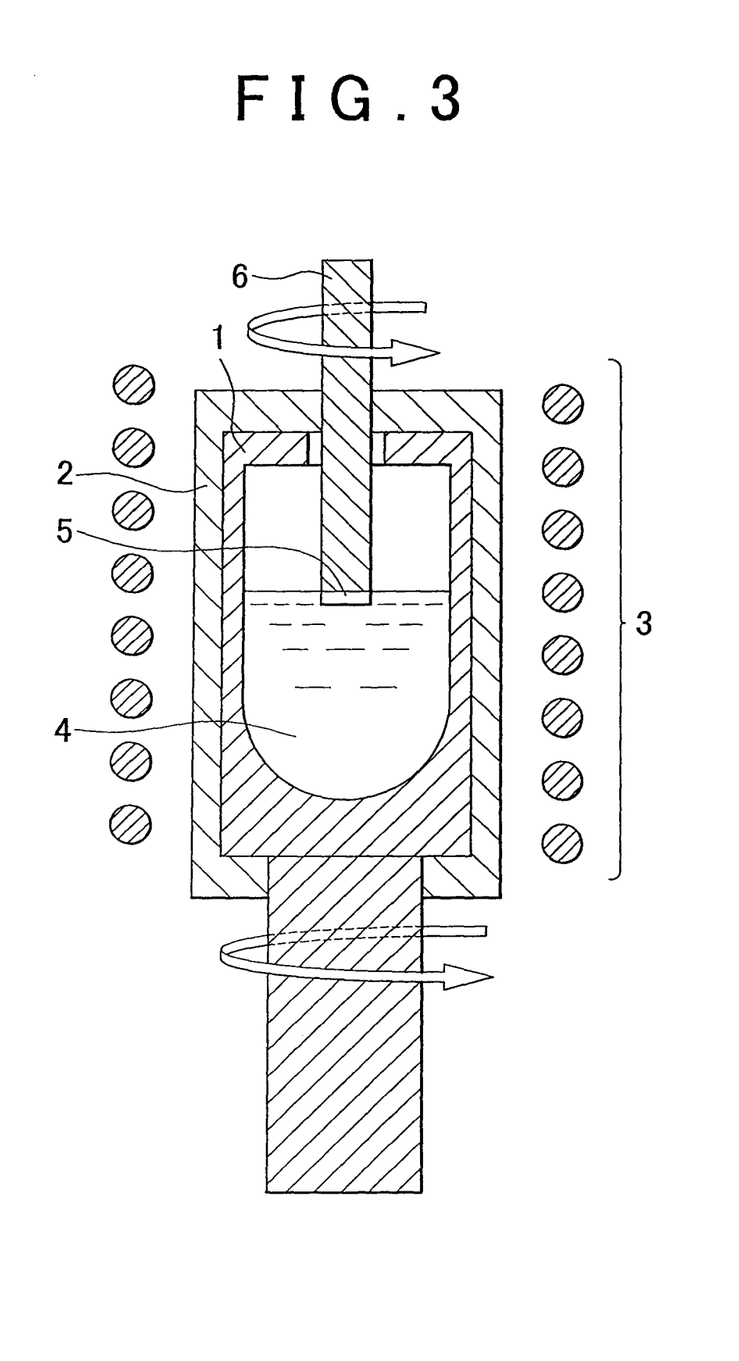
FIG. 3 is a schematic diagram showing a single crystal production device.
Figure 4:
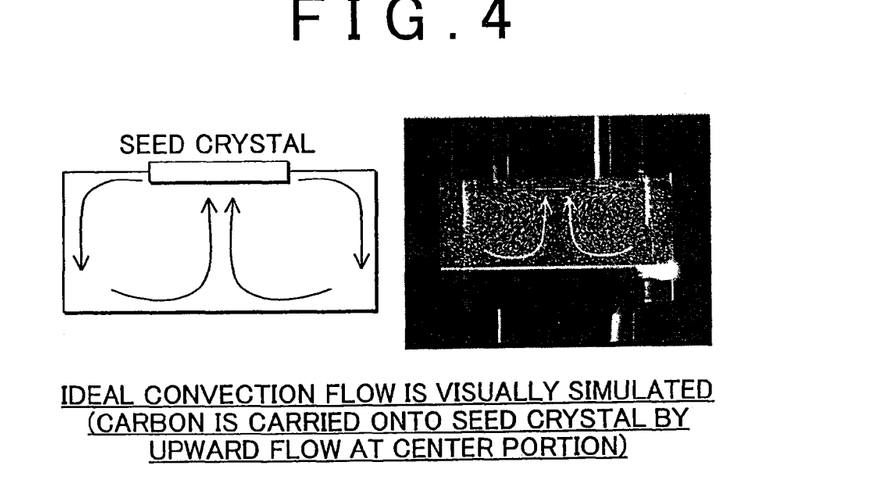
FIG. 4 is a diagram showing an ideal convection flow that is generated according to the embodiment of the invention, and that is visually simulated using the device shown in FIG. 1.

Tests in examples and tests in comparative examples were conducted using a Si—C solution growth device shown in FIG. 3. As shown in FIG. 3, a graphite crucible 1 is covered with a heat-insulating material 2. A high-frequency heating coil 3 is wound around the heat insulating material 2. A source material containing silicon, chrome, and nickel was supplied into the graphite crucible 1, and the source material was heated and dissolved using the coil 3. Thus, a solvent 4 containing silicon, chrome, and nickel was kept in the graphite crucible 1. Carbon supplied from the graphite crucible 1 was dissolved in the solvent 4 containing silicon, chrome, and nickel, and thus, a Si—C solution 4 was produced. A SiC seed crystal 5 was attached and fixed to a lower end of a seed crystal fixing shaft 6. The seed crystal fixing shaft 6 extended from above, through the heat insulating material 2, and a top portion of the graphite crucible 1. The SiC seed crystal 5 was brought into contact with a surface layer of the Si—C solution 4. Because the SiC seed crystal 5 was brought into contact with the Si—C solution 4, a temperature gradient was generated around the SiC seed crystal, and therefore, a portion of the Si—C solution, which was located around the SiC seed crystal 5, was oversaturated with the SiC crystal source material. Thus, growth of the SiC crystal proceeded on the surface of the SiC seed crystal 5, which was in contact with the Si—C solution.

While the crystal was grown, the crucible 1 and the seed crystal fixing shaft 6 were rotated according to the ACRT pattern shown in FIG. 2. The first rotational speed increase time, during which the rotational speed of the seed crystal fixing shaft 6 was increased, was 10 seconds. The first rotation maintenance time, during which the rotational speed of the seed crystal fixing shaft 6 was maintained, was 10 seconds. The first rotational speed decrease time, during which the rotational speed of the seed crystal fixing shaft 6 was decreased, was 10 seconds. The second rotational speed increase time, during which the rotational speed of the crucible 1 was increased, was 10 seconds. The second rotation maintenance time, during which the rotational speed of the crucible 1 was maintained, was 10 seconds. The rotational speed of the crucible 1 was maintained at 5 rpm during the second rotation maintenance time. The rotational speed of the seed crystal fixing shaft 6 was maintained at 40 rpm during the first rotation maintenance time. Table 1 shows values of the parameters employed in each example and each comparative example.

Table 1 also shows the growth rate of the produced crystal, and the flatness of the growth surface. Table 1 also indicates whether there was the inclusion. In each section for the growth rate, a circle indicates that the growth rate was higher than 400 μm/h, and a cross mark indicates that the growth rate was lower than 400 μm/h. In order to determine the flatness of the growth surface, the produced crystal was observed, and it was determined whether the growth surface was flat. Also, in order to determine whether there was the inclusion, the produced crystal was observed. In each section for the inclusion, a circle indicates that the inclusion was not found, and a cross mark indicates that the inclusion was found. In each section for the "Crucible rotation cycle", the term "Reversed" signifies that the rotational direction of the crucible 1 was reversed each time the rotation/stop cycle started, and the term "same" signifies that the rotational direction of the crucible 1 was not reversed.

TABLE 1

| | Rotational directions of seed crystal fixing shaft and crucible | Ts (sec) | Td (sec) | Crucible rotation cycle | Growth rate (μm/h) Determination | Flatness of growth surface | Inclusion |
|---|---|---|---|---|---|---|---|
| 1 | Same | 10 | 10 | Reversed | 525 ○ | ○ | ○ |
| 2 | Same | 1 | 10 | Reversed | 450 ○ | ○ | ○ |
| 3 | Same | 10 | 1 | Reversed | 420 ○ | ○ | ○ |
| 4 | Same | 10 | 5 | Reversed | 650 ○ | ○ | ○ |
| 5 | Opposite | 10 | 10 | Reversed | 490 ○ | ○ | ○ |
| 6 | Opposite | 1 | 10 | Reversed | 430 ○ | ○ | ○ |
| 7 | Opposite | 10 | 1 | Reversed | 415 ○ | ○ | ○ |
| 8 | Opposite | 10 | 5 | Reversed | 620 ○ | ○ | ○ |
| 9 | Same | 5 | 5 | Same | 560 ○ | ○ | ○ |
| Comparative examples | | | | | | | |
| 1 | Same | 0 | 0 | Reversed | 270 x | ○ | x |
| 2 | Same | 0 | 10 | Reversed | 330 x | ○ | x |
| 3 | Same | 10 | 0 | Reversed | 355 x | ○ | x |
| *4 | Same | 10 | 5 | Reversed | 250 x | ○ | x |

Figure 6:
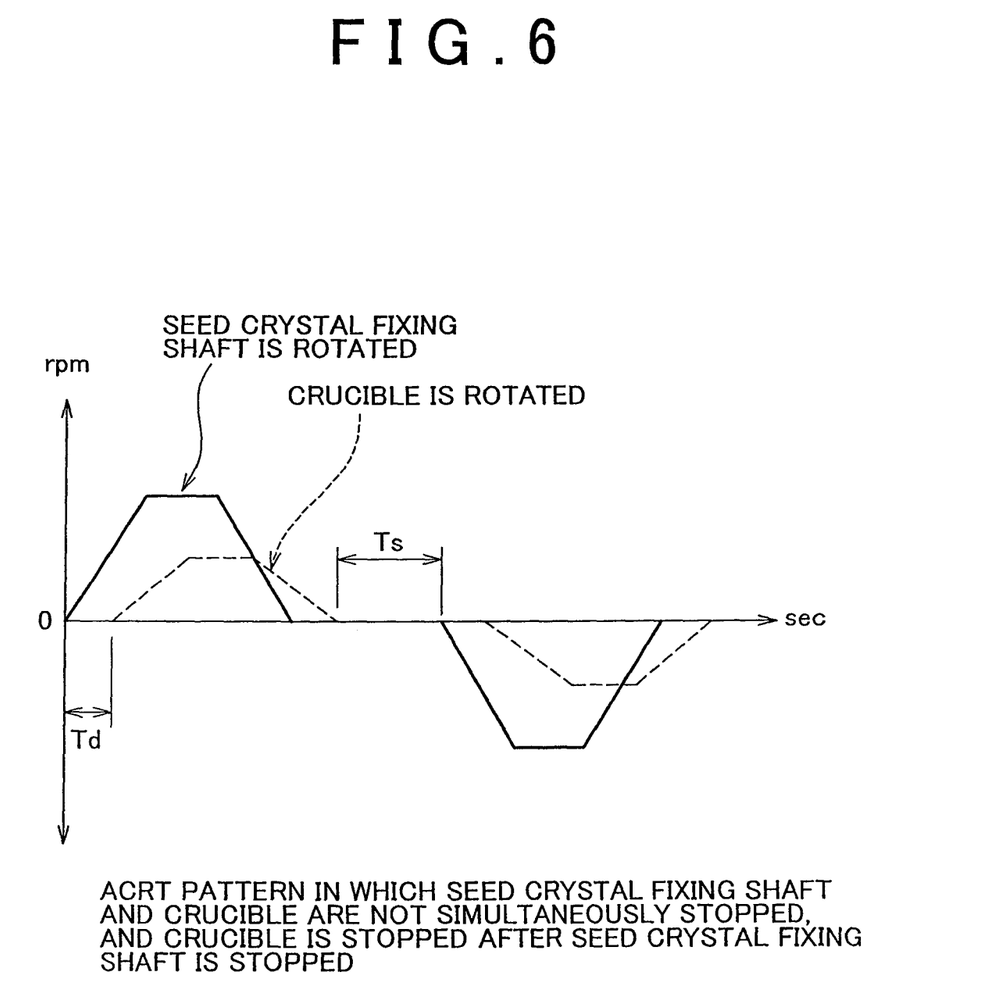
FIG. 6 shows the ACRT pattern (in which a seed crystal fixing shaft and a crucible are not simultaneously stopped, and the crucible is stopped after the seed crystal fixing shaft is stopped), which was employed in a fourth comparative example.

*Test was conducted on the condition that the seed crystal fixing shaft and the crucible were not simultaneously stopped, and the crucible was stopped after the seed crystal fixing shaft was stopped (refer to FIG. 6).

In fluid in the container (i.e., the crucible) that is rotated, a layer with a large velocity gradient, that is, a so-called Ekman layer is generated between an upper layer of the fluid and a bottom of the container, due to the adhesion condition at the bottom of the container (i.e., due to the condition that the velocity of the fluid matches the velocity of a wall). In the Ekman layer, as the fluid moves away from the wall, the direction of the flow velocity changes to a spiral direction due to the effect of Coriolis force. That is, swirling current is generated, and a flow that moves in a vertical direction is also generated. A rotational pattern, in which the rotational speed of the crucible is decreased and the rotation of the crucible is stopped to form the Ekman layer and to generate the upward flow, and then, only the seed crystal fixing shaft is rotated to increase the velocity of the upward flow, is considered to be effective for maintaining the upward flow at the center portion of the crucible to grow a high-quality crystal at a high rate. As a result of the analysis, it was confirmed that the flow rate of the upward flow is increased by stopping the rotation of the crucible and the rotation of the seed crystal fixing shaft in the cycle. Because the growth rate was increased by stopping the rotation of the crucible and the rotation of the seed crystal fixing shaft during the cycle in the actual experiment relating to the crystal growth, the result of the actual experiment also confirmed that the flow rate of the upward flow is increased by stopping the rotation of the crucible and the rotation of the seed crystal fixing shaft at a certain point during the cycle (for example, refer to the growth rates in the second comparative example, the first example, and the second example, which are different from each other in the stop time (Ts) from the stop of the rotation to the next start of the rotation).

Figure 5:
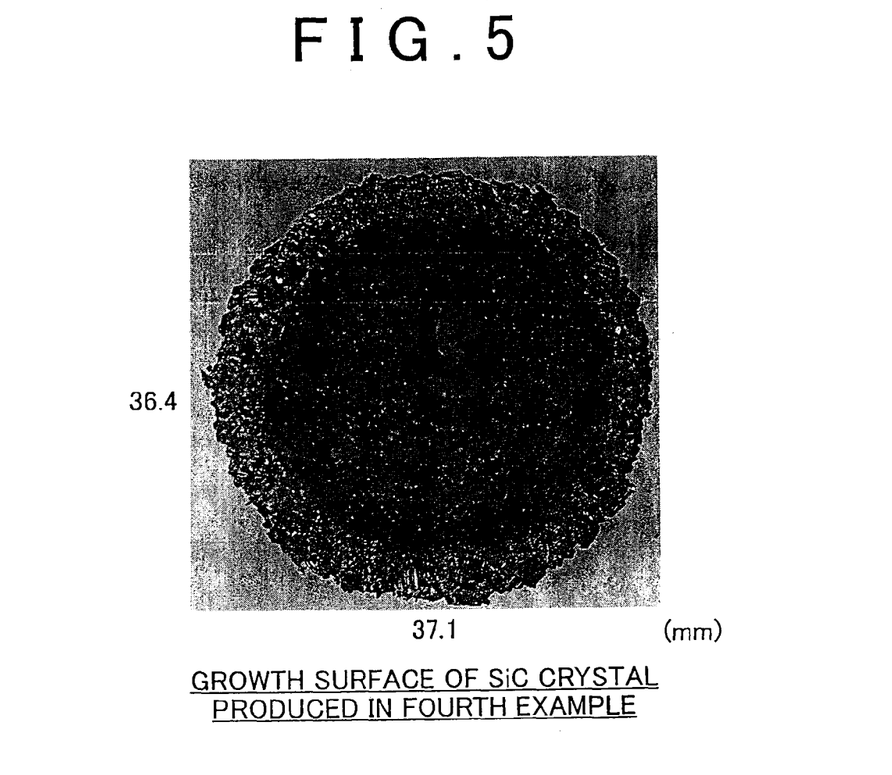
FIG. 5 is a photo showing a growth surface of a SiC crystal produced in a fourth example of the invention.

The experiment result shows that the crystal was grown at the highest rate in the fourth example in which the stop time Ts was 10 seconds, and the delay time Td was 5 seconds. FIG. 5 is a photo showing the surface of the crystal in the fourth example. Although residues of the solution were found at a periphery and a portion of the crystal, it was confirmed that the growth surface was flat. Also, the growth rate was higher than 600 μm/h.

When each of the stop time Ts and the delay time Td was 0 second, or when the stop time Ts or the delay time Td was 0 second (i.e., in the first to third comparative examples), the growth rate was extremely decreased, though the flat growth surface was ensured.

In the fourth comparative example, the growth rate was extremely decreased. As long as the flow of the solution was observed using the device that visually simulates the flow of the solution, the crucible was rotated even after the seed crystal fixing shaft was stopped under the condition shown in FIG. 6, and thus, the low-temperature fluid, which had been cooled by the seed crystal fixing shaft, moved downward. Then, the crucible was stopped, and accordingly, the upward flow was generated due to the Ekman flow. However, the upward flow did not become strong because of the inertia of the downward flow that had already been generated. It is presumed that the same phenomenon occurs during the actual growth.

The invention claimed is:

1. A method of producing a SiC single crystal, comprising:
    growing the SiC single crystal on a SiC seed crystal by bringing the SiC seed crystal, which is fixed at a rotatable seed crystal fixing shaft, into contact with a solution produced by dissolving carbon in melt containing silicon in a rotatable crucible;
    starting rotation of the seed crystal fixing shaft, and starting rotation of the crucible after a predetermined delay time of 1 to 10 seconds;
    then stopping the rotation of the seed crystal fixing shaft and the rotation of the crucible simultaneously;
    then stopping the seed crystal fixing shaft and the crucible for a predetermined stop time of 1 to 10 seconds; and
    repeating a rotation/stop cycle including starting the rotation of the seed crystal fixing shaft, and starting the rotation of the crucible after the predetermined delay time, then stopping the rotation of the seed crystal fixing shaft and the rotation of the crucible simultaneously, and then stopping the seed crystal fixing shaft and the crucible for the predetermined stop time.

2. The method according to claim 1, wherein the predetermined delay time is adjusted according to viscosity of the solution.

3. The method according to claim 2, wherein the predetermined stop time is adjusted according to the viscosity of the solution.

4. The method according to claim 1, wherein the predetermined delay time is 5 seconds, and the predetermined stop time is 10 seconds.

5. The method according to claim 1, wherein after the rotation of the seed crystal fixing shaft is started, a rotational speed of the seed crystal fixing shaft is increased, and then, the rotational speed of the seed crystal fixing shaft is maintained at a first predetermined value for a first rotation maintenance time, and then, the rotational speed of the seed crystal fixing shaft is decreased to zero; and
after the rotation of the crucible is started, a rotational speed of the crucible is increased, and then, the rotational speed of the crucible is maintained at a second predetermined value for a second rotation maintenance time, and then, the rotational speed of the crucible is decreased to zero.

6. The method according to claim 5, wherein in the rotation/stop cycle, a first rotational speed increase time, during which the rotational speed of the seed crystal fixing shaft is increased, is 1 to 10 seconds;
the first rotation maintenance time is 1 to 10 seconds;
a first rotational speed decrease time, during which the rotational speed of the seed crystal fixing shaft is decreased, is 1 to 10 seconds;
a second rotational speed increase time, during which the rotational speed of the crucible is increased, is 1 to 10 seconds;
the second rotation maintenance time is 1 to 10 seconds; and
a second rotational speed decrease time, during which the rotational speed of the crucible is decreased, is 1 to 10 seconds.

7. The method according to claim 1, wherein in the rotation/stop cycle, the seed crystal fixing shaft and the crucible are rotated in a same rotational direction.

* * * * *